(12) United States Patent
Maeno et al.

(10) Patent No.: US 6,849,906 B2
(45) Date of Patent: Feb. 1, 2005

(54) STANDARD-CELL TYPE SEMICONDUCTOR INTEGRATED CIRCUIT DEVICE WITH A MIXED ARRANGEMENT OF STANDARD CELLS DIFFERING IN HEIGHT

(75) Inventors: Muneaki Maeno, Yokohama (JP); Toshiki Morimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/365,415

(22) Filed: Feb. 12, 2003

(65) Prior Publication Data

US 2004/0031995 A1 Feb. 19, 2004

(30) Foreign Application Priority Data

Aug. 14, 2002 (JP) ....................... 2002-236496

(51) Int. Cl.⁷ .................. H01L 29/76; H01L 29/94; H01L 31/62; H01L 31/113; H01L 31/119
(52) U.S. Cl. ..................................... 257/390
(58) Field of Search ................. 257/390–412

(56) References Cited

U.S. PATENT DOCUMENTS 5,631,492 A * 5/1997 Ramus et al. ............... 257/532
6,410,991 B1 * 6/2002 Kawai et al. ............... 257/392

FOREIGN PATENT DOCUMENTS

| JP | 05-315448 | 11/1993 |
| JP | 06-140505 | 5/1994 |
| JP | 2571742 | 2/1998 |
| JP | 2000-022084 | 1/2000 |
| JP | 2001-007209 | 1/2001 |
| JP | 2002-190572 | 7/2002 |

OTHER PUBLICATIONS

U.S. Appl. No. 09/819,532, filed Mar. 27, 2001, Umemoto et al.

U.S. Appl. No. 09/665,943, filed Sep. 21, 2000, Sei et al.

* cited by examiner

Primary Examiner—Cuong Nguyen
(74) Attorney, Agent, or Firm—Hogan & Hartson, LLP (57) ABSTRACT

A first cell block in which a plurality of standard cells with a large cell height are arranged and a second cell block in which a plurality of standard cells with a small cell height are arranged. In the second cell block, transistors are formed whose shape and characteristics are practically the same as those of the transistors provided in the standard cells with the large cell height arranged in the first cell block.

7 Claims, 7 Drawing Sheets

STANDARD-CELL TYPE SEMICONDUCTOR INTEGRATED CIRCUIT DEVICE WITH A MIXED ARRANGEMENT OF STANDARD CELLS DIFFERING IN HEIGHT

CROSS-REFERENCE TO RELATED APPLICATIONS

This application is based upon and claims the benefit of priority from the prior Japanese Patent Application No. 2002-236496, filed Aug. 14, 2002, the entire contents of which are incorporated herein by reference.

BACKGROUND OF THE INVENTION

1. Field of the Invention

This invention relates to a standard-cell type semiconductor integrated circuit device with a mixed arrangement of standard cells differing in cell height.

2. Description of the Related Art

In a standard-cell type semiconductor integrated circuit device, a large number of standard cells are designed to have the same height in order that they can be arranged closely with high density.

Making the cell height small is effective in realizing high integration of standard cells. However, when large-sized transistors are needed for high-speed operation, cells with a small height require a large number of small-sized transistors to be arranged and connected in parallel to form large-sized transistors.

When a plurality of transistors are arranged and connected in parallel to form large-sized transistors, each cell has more frontage than height, or is oblong. As a result, more inefficient parts area are produced. They include the SDG (source, drain, and gate) regions in n-channel and p-channel MOS transistors, and the boundary between the p-well and the n-well.

Therefore, cells with more height than frontage, or lengthwise cells, are effective in terms of area in configuring large-sized transistors.

When standard cells greatly differing in cell height are arranged in the same column, the position of the boundary between the p-well and the n-well in a standard cell with a small cell height differs from that in a standard cell with a large cell height. This makes it difficult to arrange standard cells differing in cell height in the same column.

Accordingly, in one column, only standard cells with the same height are arranged. In the standard cells with the same cell height, transistors of the same size are provided. In the standard cells differing in cell height, transistors differing in size according to cell height are provided. Transistors differing in size differ in characteristics.

As described above, since only standard cells with the same cell height are arranged in one column, standard cells with a large cell height which need large-sized transistors and are required to operate at high speeds are arranged in one cell block and standard cells with a small cell height which are not required to operate at high speeds are arranged in another cell block in the prior art semiconductor integrated circuit device.

In a semiconductor integrated circuit device in which a plurality of cell blocks are provided, when signal lines are provided so as to cross cell blocks, the line length becomes long, which delays the signals. To overcome this problem, buffer amplifiers, called repeaters, are inserted in the signal lines to reduce the delay time in the signals caused by the lines.

However, in the case where a plurality of repeaters are inserted in the path of one signal, when the plurality of repeaters are provided in different cell blocks where standard cells differing in cell height are arranged, the transistors differ in characteristics, because the transistors arranged in the standard cells differ in size. As a result, the delay time of the signal in the signal path in which each repeater is inserted differs from one signal path to another. Consequently, the desired characteristic might not be obtained by the circuit that receives the signal.

As described above, the size of transistors arranged in the standard cells is determined by the cell height of the standard cells. As a result, circuits composed of standard cells in different cell blocks in which standard cells differing in cell height are provided differ in characteristics. This makes it impossible to obtain the desired characteristics. Thus, a solution to this problem has been desired.

BRIEF SUMMARY OF THE INVENTION

According to an aspect of the present invention, there is provided a standard-cell type semiconductor integrated circuit device comprises: a first cell block in which a plurality of first standard cells are arranged, each cell having a first cell height and having first transistors provided therein; and a second cell block in which a plurality of second standard cells with a second cell height different from the first cell height are arranged, the plurality of second standard cells including standard cells in which second transistors whose characteristics are the same as those of the first transistors are provided.

DETAILED DESCRIPTION OF THE INVENTION

Hereinafter, referring to the accompanying drawings, embodiments of the present invention will be explained in detail. Like parts are indicated by corresponding reference numerals throughout all the drawings and repeated explanation of them is omitted.

Figure 1:
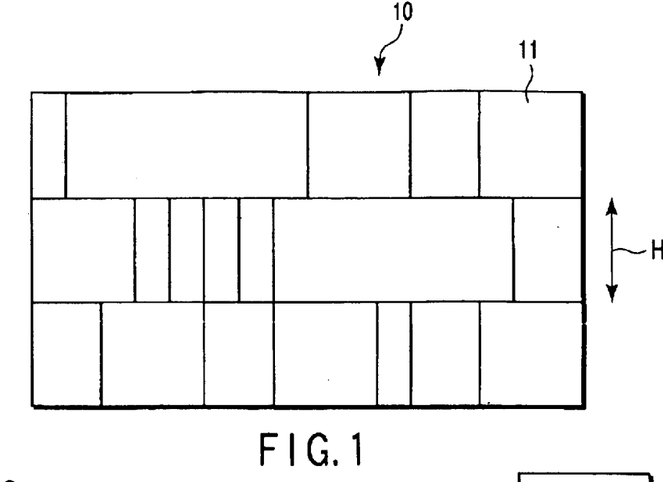
FIG. 1 is a plan view of a standard-cell type semiconductor integrated circuit device.

FIG. 1 shows an example of the layout of a cell block provided in a standard-cell type semiconductor integrated circuit device. Generally, in a standard-cell type semiconductor integrated circuit device, a large number of standard cells are designed to have the same height as shown in FIG. 1 so that they can be arranged closely with high density. In a cell block 10, a plurality of standard cells 11 are arranged in column direction. There are provided a plurality of columns (in this example, three columns) of standard cells 11. The height of each standard cell 11, that is, the cell height, corresponds to the outline dimension of the standard cell in the direction in which standard cells 11 are arranged, that is, in the direction perpendicular to the column direction. The cell height is represented by H in FIG. 1.

Making the cell height small is effective in realizing high integration of standard cells. However, when large-sized transistors are needed for high-speed operation, cells with a small height require a large number of small-sized transistors to be arranged as shown in the plan view of FIG. 2 and connected in parallel to form large-sized transistors.

Figure 2:
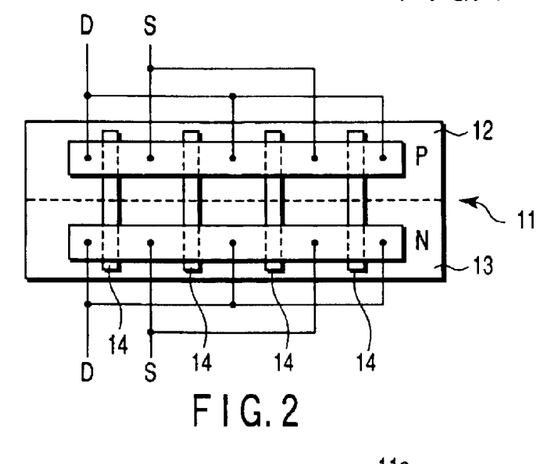
FIG. 2 is a plan view of an oblong standard cell including large-sized transistors composed of a plurality of transistors connected in parallel.

FIG. 2 shows an example of one standard cell 11. In a p-well region 12, a plurality of n-type diffusion regions that function as the source and drain of an NMOS transistor are provided. In an n-well region 13, a plurality of p-type diffusion regions that function as the source and drain of a PMOS transistor are provided. In each of the NMOS transistor and PMOS transistor, the n-type or p-type diffusion regions that function as the source are connected to each other with wirings and drawn as a source electrode S. The n-type or p-type diffusion regions that function as the drain are connected to each other with wirings and drawn as a drain electrode D. Numerals 14, 14, etc., indicate gate electrodes. These gate electrodes 14 are connected to each other with wirings.

As shown in FIG. 2, when an attempt is made to arrange a plurality of transistors and connect the transistors in parallel to form a large-sized transistor, a standard cell 11 has more frontage than height, or becomes oblong. This produce more inefficient parts in area. These include the SDG regions of the NMOS transistors and PMOS transistors and the boundary between the p-well and n-well regions.

Figure 3:
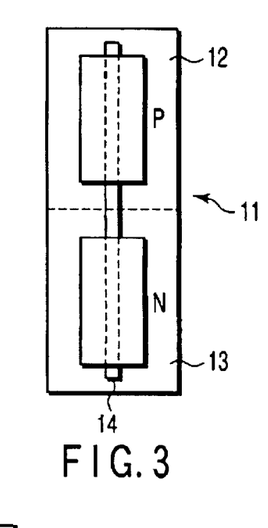
FIG. 3 is a plan view of a lengthwise standard cell including large-sized transistors.

To overcome this disadvantage, the use of cells with more height than frontage, or lengthwise cells, is effective in terms of area in forming a large-sized transistor as shown in FIG. 3.

Figure 4:
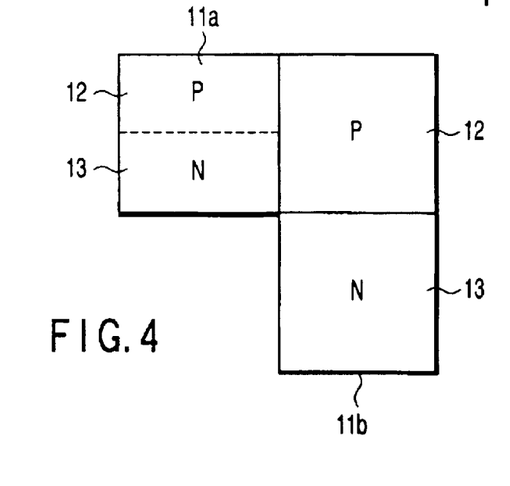
FIG. 4 is a plan view of standard cells which differ in cell height and are arranged in the same column.

However, it is difficult to arrange standard cells differing greatly in cell height in the same column, since the position of the boundary between the p-well regions 12 and n-well regions 13 in the standard cell 11a with a small cell height differs from that in the standard cell 11b with a large cell height.

Therefore, only standard cells with the same cell height are arranged in one column. In addition, transistors of the same size are provided in standard cells with the same cell height. In standard cells with different cell heights, transistors differing in size are arranged according to the cell height. Transistors differing in size differ in characteristics.

As described above, since only standard cells with the same cell height are arranged in one column, standard cells with a large cell height which require large-sized transistors and operate at high speeds are arranged in one cell block and standard cells with a small cell height which are not required to operate at high speeds are arranged in another cell block.

In a semiconductor integrated circuit device in which a plurality of cell blocks are provided, when signal lines are provided so as to cross cell blocks, buffer amplifiers, called repeaters, are inserted in the signal lines to reduce the delay time in the signals caused by the lines.

However, in the case where a plurality of repeaters are inserted in a path of one signal, when the plurality of repeaters are provided in different cell blocks where standard cells differing in cell height are arranged, the transistors differ in characteristics, since the transistors arranged in the standard cells differ in size. As a result, the delay time of the signal in the signal path in which each repeater is inserted differs from one signal path to another. Thus, the desired characteristic might not be obtained by the circuit that receives the signal.

Figure 5:
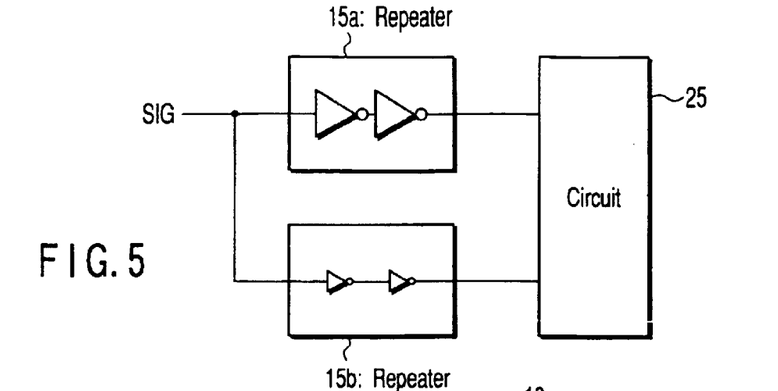
FIG. 5 is a circuit diagram schematically showing a signal path in transmitting a signal by means of a standard-cell type semiconductor integrated circuit device.

FIG. 5 is a circuit diagram to help give a general idea of the above problem. Signal SIG is supplied to a circuit 25 not only via a repeater 15a composed of a standard cell in which a large-sized transistor is provided, but also via a repeater 15b composed of a standard cell in which a small-sized transistor is provided.

In FIG. 5, the difference in size between the transistors in the standard cells is expressed by the difference in size between the symbols of the two inverting circuits that constitute the repeaters 15a, 15b.

Since the repeaters 15a, 15b are composed of inverting circuits that use transistors differing in size and characteristics, the delay time of the output signal from the repeater 15a with respect to the signal SIG differs from that of the output signal from the repeater 15b. The difference in delay time has an adverse effect on the operation of the circuit 25 that receives the outputs from the repeaters 15a, 15b.

To reduce the power consumption or realize high-speed operation in a circuit composed of standard cells in a cell block in which a plurality of standard cells to which a power supply voltage of VDD1 is supplied are arranged, standard cells to which a power supply voltage of VDD2 different from the power supply voltage VDD1 is supplied might be used.

Figure 6:
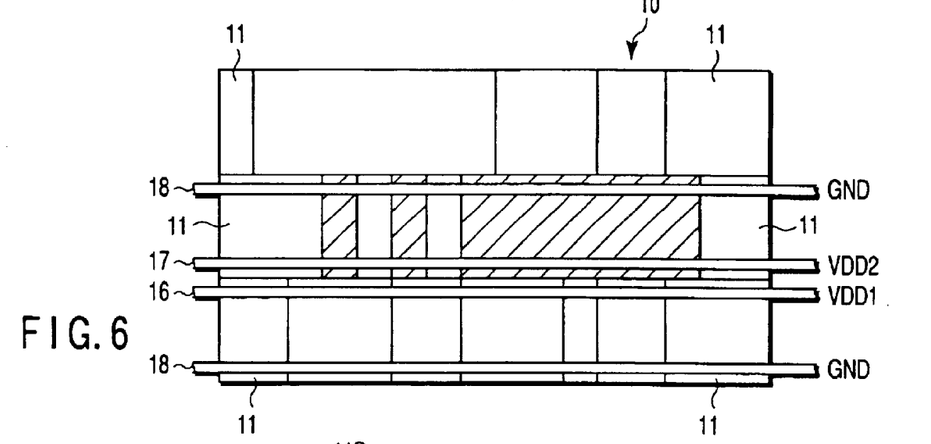
FIG. 6 is a plan view of a cell block to which a plurality of power supply voltages are supplied.

Since only one type of power supply voltage is supplied to the cell block, standard cells that use power supply voltage VDD2 cannot be arranged in the cell block. To use a different power supply voltage, another power-supply line 17 that supplies power supply voltage VDD2 may be arranged in the standard cells in a column different from the column of the standard cells 11 in which the power supply line 16 that supplies power supply voltage VDD1 is provided. In FIG. 6, numerals 18, 18 are ground lines.

With this arrangement, only the standard cells 11 to which power supply voltage VDD2 is supplied can be arranged in the column of the standard cells 11 in which the power-supply line 17 is arranged. As a result, many empty regions where no element is practically formed appear, which decreases the degree of integration. The shaded regions in FIG. 6 represent empty regions.

First Embodiment

Figure 7:
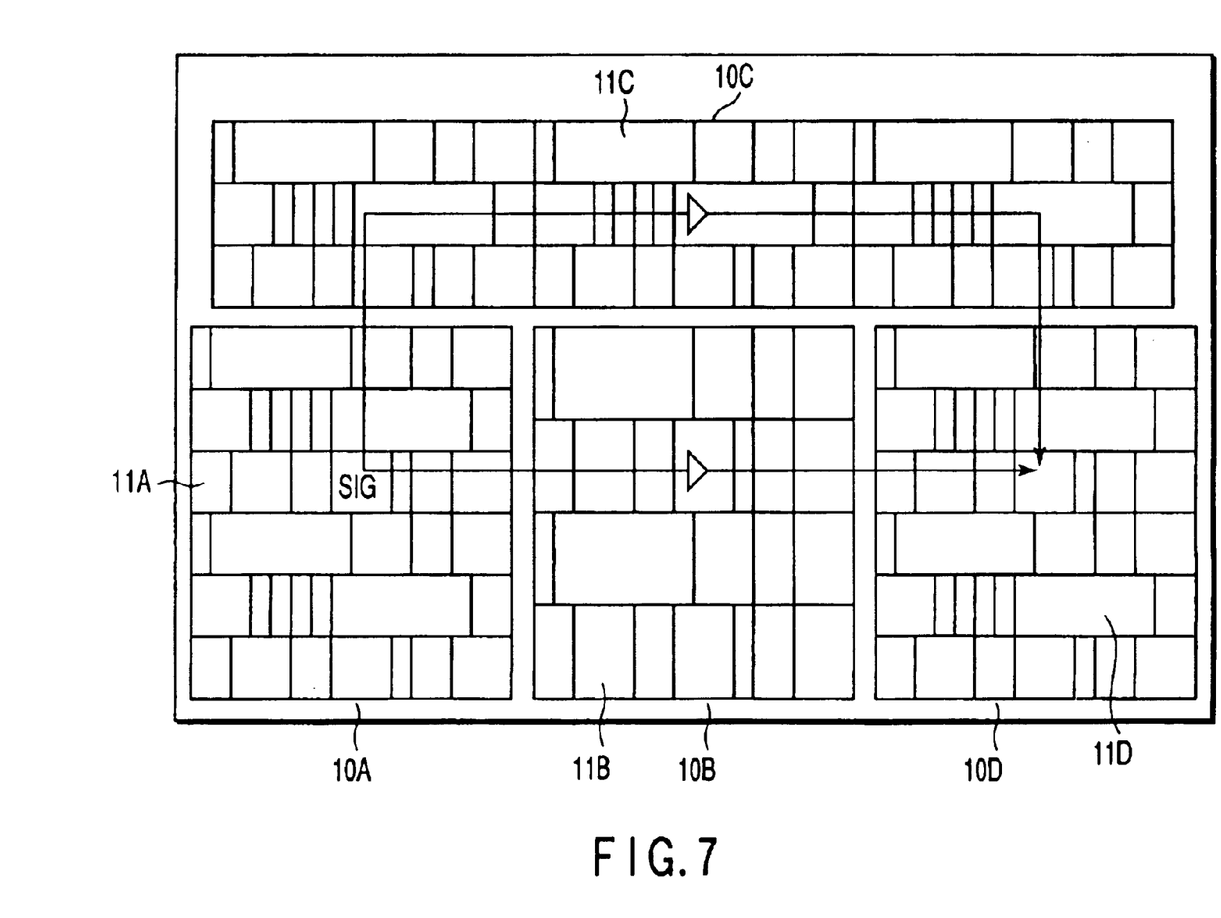
FIG. 7 is a plan view of a layout of a semiconductor integrated circuit device according to a first embodiment of the present invention.

FIG. 7 shows a layout of a standard-cell type semiconductor integrated circuit device according to a first embodiment of the present invention.

In FIG. 7, a plurality of cell blocks (for example, four cell blocks 10A to 10D) are shown. Each of the cell blocks includes a plurality of columns. Each column is composed of standard cells arranged in a line. In the cell block 10A, a plurality of standard cells 11A with a small cell height are arranged. In the cell block 10B, a plurality of standard cells 11B larger in cell height than the standard cells 11A in the cell block 10A, or with a large cell height, are arranged. In the cell blocks 10C and 10D, a plurality of standard cells 11C, 11D with the same height as the standard cells 11A in the cell block 10A, or with a small cell height, are arranged respectively.

As shown by the arrows in FIG. 7, the signal SIG output from a circuit composed of standard cells 11A in the cell block 10A is supplied to a circuit composed of standard cells 11D in the cell block 10D via a repeater composed of standard cells 11B in the cell block 10B. The signal SIG then passes through a repeater composed of standard cells 11C in the cell block 10C and is supplied to a circuit composed of standard cells 11D in the cell block 10D.

It is assumed that the same power supply voltage is supplied to all of the four cell blocks 10A to 10D in FIG. 7.

Figure 8A:
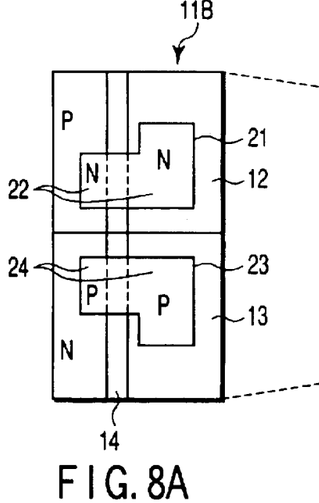
FIGS. 8A and 8B are plan views of standard cells provided in different cell blocks in FIG. 7.
Figure 8B:
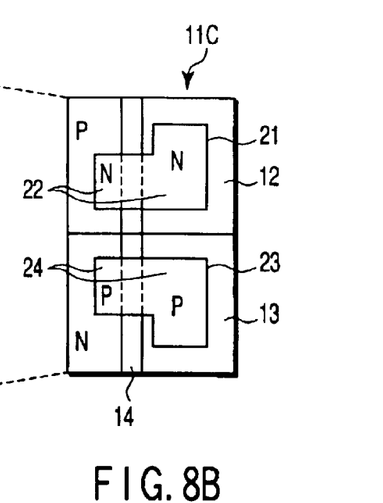

FIG. 8A and FIG. 8B show an example of the standard cells 11B and 11C used for constructing the repeaters in the cell blocks 10B and 10C of FIG. 7. In each of the standard cells 11B and 11C, a CMOS transistor composed of a PMOS transistor and an NMOS transistor is provided. In each of the standard cells 11B and 11C, a p-well region 12 and an n-well region 13 are arranged so as to be adjacent to each other. In the p-well region 12, a pair of n-type diffusion regions 22 functioning as the source and drain of a MOS transistor 21 is provided. In the n-well region 13, a pair of p-type diffusion regions 24 functioning as the source and drain of a PMOS transistor 23 is provided. A gate electrode 14 is provided so as to continuously cover each of the pair of n-type diffusion regions 22 and the pair of p-type diffusion regions 24. The width of the gate electrode 14 is equivalent to the gate width of the transistor.

The size of the transistors 21, 23 provided in the standard cells 11B and 11C is the same as that of the transistors in the standard cell 11C with the small cell height. Specifically, the NMOS transistors 21 in the standard cells 11B and 11C are made so that these have basically the same gate width, or the same width of the gate electrode 14, the same area of the source and drain diffusion regions (that is, n-type diffusion region 22), and the same transistor shape. The PMOS transistors 23 in the standard cells 11B and 11C are made so that these have basically the same gate width, or the same width of the gate electrode 14, the same area of the source and drain diffusion regions (that is, p-type diffusion region 24), and the same transistor shape. The NMOS transistors 21 and the PMOS transistors 23 are formed under the same processing conditions. Consequently, in the individual transistors arranged in the standard cells 11B and 11C, the NMOS transistors 21 have practically the same characteristics, and the PMOS transistors 23 have practically the same characteristics.

Figure 9A:
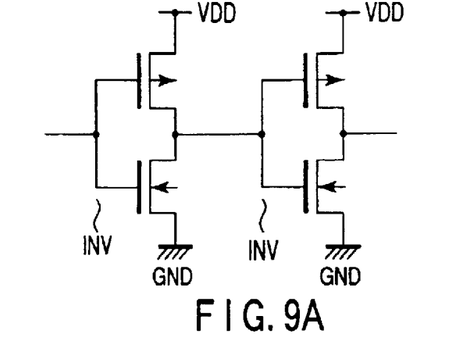
FIG. 9A is a circuit diagram of a repeater.
Figure 9B:
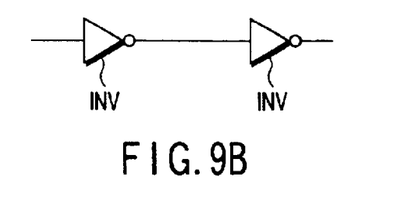
FIG. 9B is an equivalent circuit diagram of the repeater.

As shown in FIGS. 9A and 9B, a repeater is composed of a cascade connection of two CMOS inverters INVs, each being made up of a PMOS transistor and an NMOS transistor.

Figure 10:
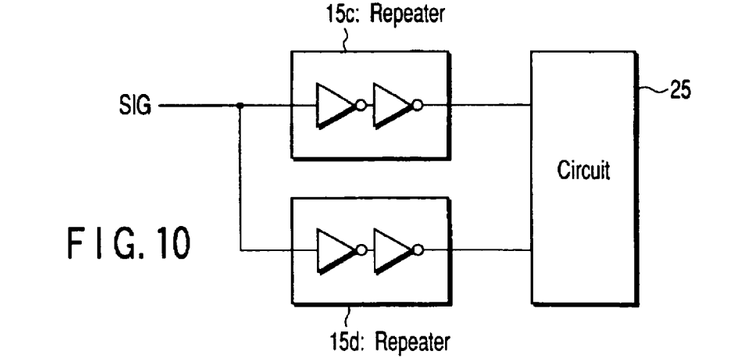
FIG. 10 is a circuit diagram of a signal transmitting path circuit in the semiconductor integrated circuit device of FIG. 7.

FIG. 10 shows a circuit configuration of a signal SIG transmitting path in FIG. 7. The signal SIG is supplied to a circuit 25 in the cell block 10D not only via a repeater 15c composed of standard cells 11B in the cell block 10B, but also via a repeater 15d composed of standard cells 11C in the cell block 10C in which transistors of the same size as the transistors in the standard cell 11B are provided.

Since the repeaters 15c, 15d are composed of the inverters made up of transistors that are of the same size and have practically the same characteristics, a delay time of an output signal from the repeater 15c with respect to the signal SIG is practically the same as that of an output signal from the repeater 15d. Consequently, the circuit 25 which receives the output signals from the repeaters 15c, 15d and then operates is not adversely affected by the difference in delay time between the input signals.

Furthermore, as shown in FIGS. 8A and 8B, the shapes of the transistors arranged in the standard cells 11B and 11C used for constructing the repeaters are practically the same. Therefore, even if the manufacturing processes vary during manufacture, changes in the shapes of the transistors are the same. That is, even when there are variations in the manufacturing processes, a difference in delay time between the repeaters 15c, 15d is less liable to occur.

Second Embodiment

In the first embodiment, the same power supply voltage is supplied to a plurality of cell blocks, for example, four cell blocks 10A to 10D.

There is no need to equalize all the power supply voltages supplied to a plurality of cell blocks. To reduce the power consumption of a circuit composed of standard cells in a cell block or operate the circuit at high speed, the power supply voltage supplied to a cell block may be made different from that supplied to another cell block.

Figure 11:
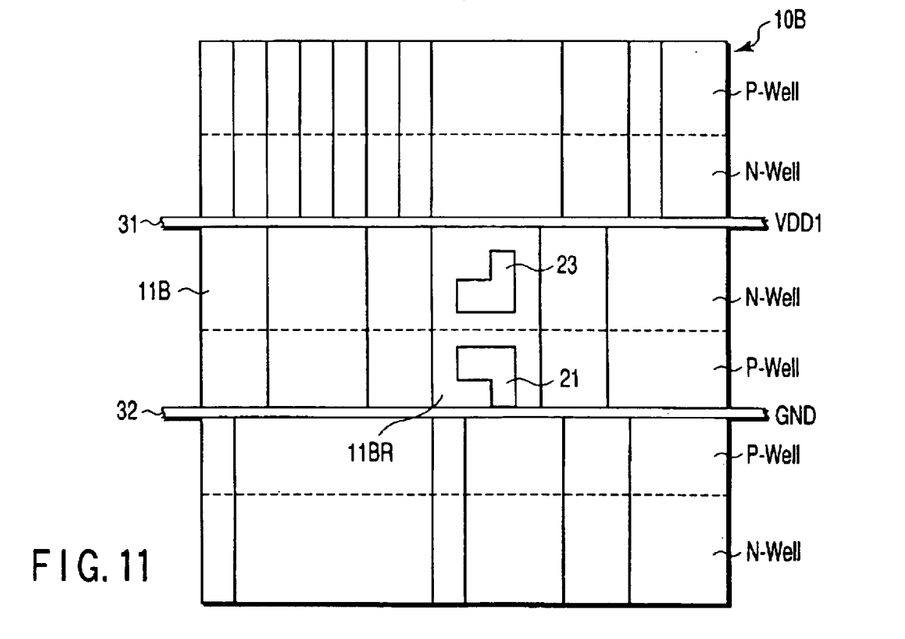
FIG. 11 is a plan view of a part of a cell block in a semiconductor integrated circuit device according to a second embodiment of the present invention.

FIG. 11 shows a part of one cell block 10B in FIG. 7. In the cell block 10B, a power supply line 31 that supplies power supply voltage VDD1 to a plurality of standard cells 11B and a ground line 32 are provided along a column of standard cells 11B. The power supply line 31 for supplying power supply voltage VDD1 and the ground line 32 are shared by the two columns adjacent to each other vertically in FIG. 11.

A standard cell used for constructing the repeater is indicated by reference numeral 11BR in the cell block 10B.

Figure 12:
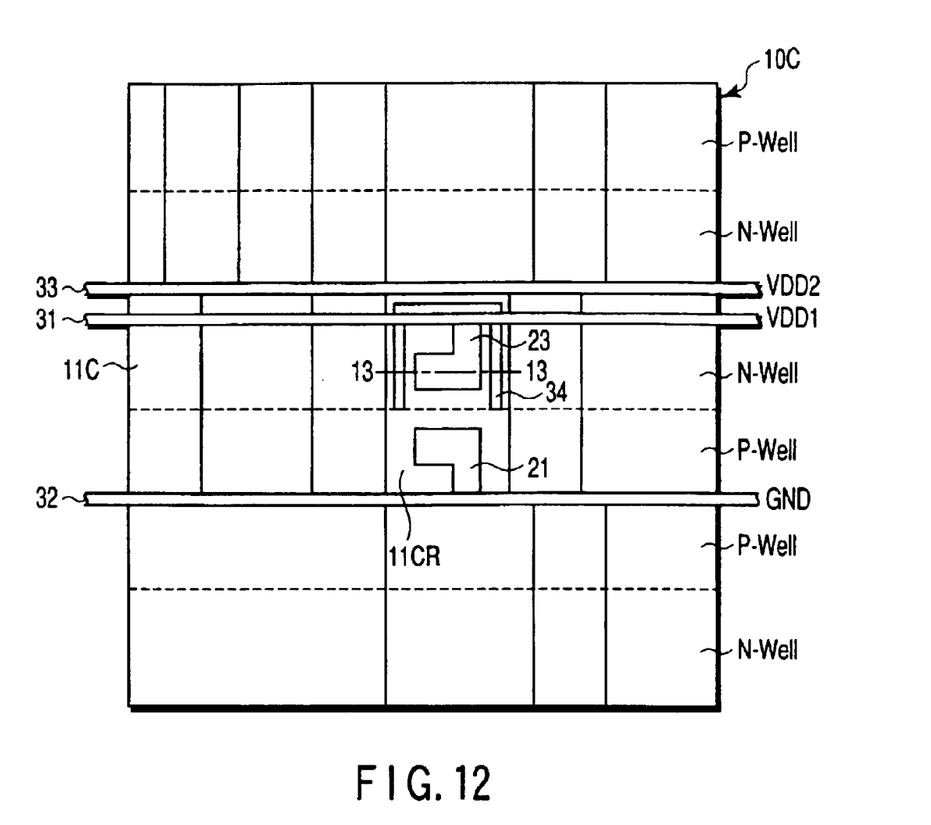
FIG. 12 is a plan view of a part of another cell block different from that of FIG. 11 in the semiconductor integrated circuit device according to the second embodiment.

FIG. 12 shows a part of the cell block 10C in FIG. 7. In the cell block 10C, a power supply line 33 that supplies power supply voltage of VDD2 and a ground line 32 are provided so as to run along a plurality of standard cells 11C. The power supply line 33 and the ground line 32 are shared by the two columns adjacent to each other vertically in FIG. 12.

A power supply line 31 for supplying VDD1 is provided so as to run along the power supply line 33 in the column including a standard cell 11CR used for constructing the repeater. The power supply line 31 is provided farther inside the cell than the power supply line 33.

Power supply voltage VDD1 of the power supply line 31 is supplied to the standard cell 11CR, whereas power supply voltage VDD2 of the power supply line 33 is supplied to the other standard cells 11C in the same column.

Around a PMOS transistor 23 provided in the n-well region of the standard cell 11CR to which power supply voltage VDD2 is supplied, an isolating region 34 for potentially separating the PMOS transistor 23 from another PMOS transistor formed in the same n-well region is provided.

In FIGS. 11 and 12, the gate electrode of each of the NMOS transistor 21 and PMOS transistor 23 is not shown.

Figure 13:
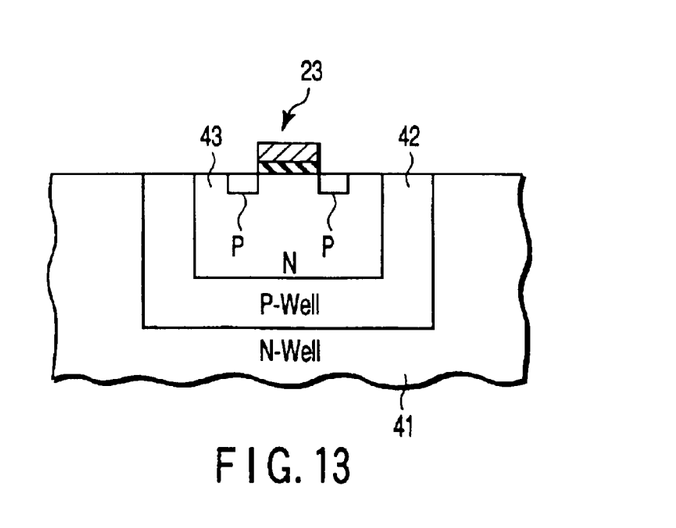
FIG. 13 is a sectional view of a transistor in the standard cell shown in FIG. 12.

FIG. 13 shows a sectional view taken along line 13–13 of FIG. 12. As shown in FIG. 13, the isolating region 34 may be made of a p-well 42 formed in an n-well 41. In the p-well 42, an n-well 43 in which a PMOS transistor 23 is to be formed is formed. The n-well 43 is separated from the surrounding n-well 41 by the p-well 42.

According to the second embodiment, even when the value of the power supply voltage supplied to the cell block 10B differs from that to the cell block 10C, the same power supply voltage (VDD1) can be supplied to the standard cells 11BR, 11CR used for constructing the repeaters in the cell blocks 10B and 10C. As a result, even when a plurality of repeaters are composed of standard cells in the cell blocks 10B and 10C to which different power supply voltages are supplied, the characteristics of the plurality of repeaters can be equalized.

In the cell block 10C, the standard cell 11CR used for constructing a repeater and the other standard cells 11C can be arranged in the same column. Consequently, the empty regions in the standard cells differing in power supply voltage can be reduced compared with the case where they are arranged in different columns, which helps increase the degree of integration.

Third Embodiment

In the first embodiment, the sizes of transistors arranged in the standard cells 11B and 11C used for constructing repeaters have been equalized so as to fit the transistors in the standard cell 11C with the small cell height.

In contrast with the first embodiment, in a third embodiment of the present invention, the sizes of transistors arranged in the standard cells 11B and 11C used for constructing repeaters are equalized so as to fit the size of transistors in the standard cell 11B with the large cell height.

Because transistors of the same size as the transistors in a standard cell with the large cell height are arranged in a standard cell with the small cell height, not all of the transistors might fit in the standard cell with the small cell height.

Figure 14:
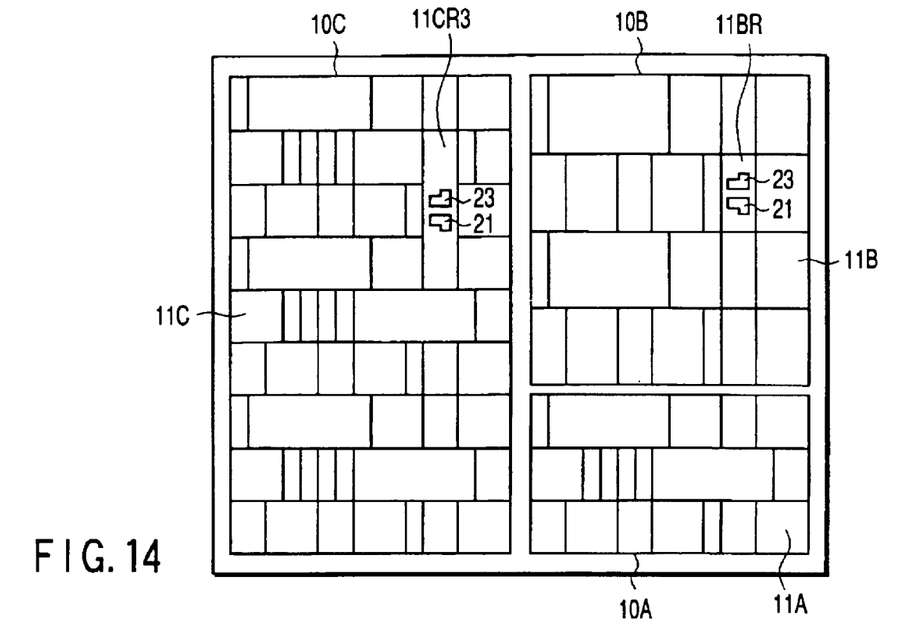
FIG. 14 is a plan view of a layout of a semiconductor integrated circuit device according to a third embodiment of the present invention.

In the third embodiment, to overcome this problem, a standard cell with a cell height three times as great as that of the standard cell 11C is provided in the cell block 10C in which standard cells 11C with the small cell height are arranged as shown in the plan view of FIG. 14. In the standard cell 11CR3, transistors of the same size as the transistors arranged in the standard cell 11B with the large cell height are provided. In this case, the same power supply voltage is supplied to all of the cell blocks 10A to 10C.

With this configuration, transistors of the same size as the transistors in the standard cell 11BR with the large cell height can be arranged easily in the cell block 10C in which standard cells 11C with the small cell height are arranged.

While in the third embodiment, the standard cell 11CR3 whose cell height is three times as great as that of the standard cell 11C has been provided in the cell block 10C and, in the standard cell 11CR3, transistors of the same size as the transistors arranged in the standard cell 11BR with the large cell height have been arranged, the third embodiment is not limited to this.

That is, standard cells with a larger cell height than that of the standard cell 11C with the normal cell height are arranged in the cell block 11C. Standard cells whose cell height is two or more times as great as that of the standard cell 11C may be arranged.

The arrangement of the standard cell 11CR3 with a triple cell height is effective because the area of the standard cell 11CR3 does not become so large and because there is no need to bend the boundary line between the p-well region and the n-well region between other adjacent standard cells in the column direction.

Figure 15:
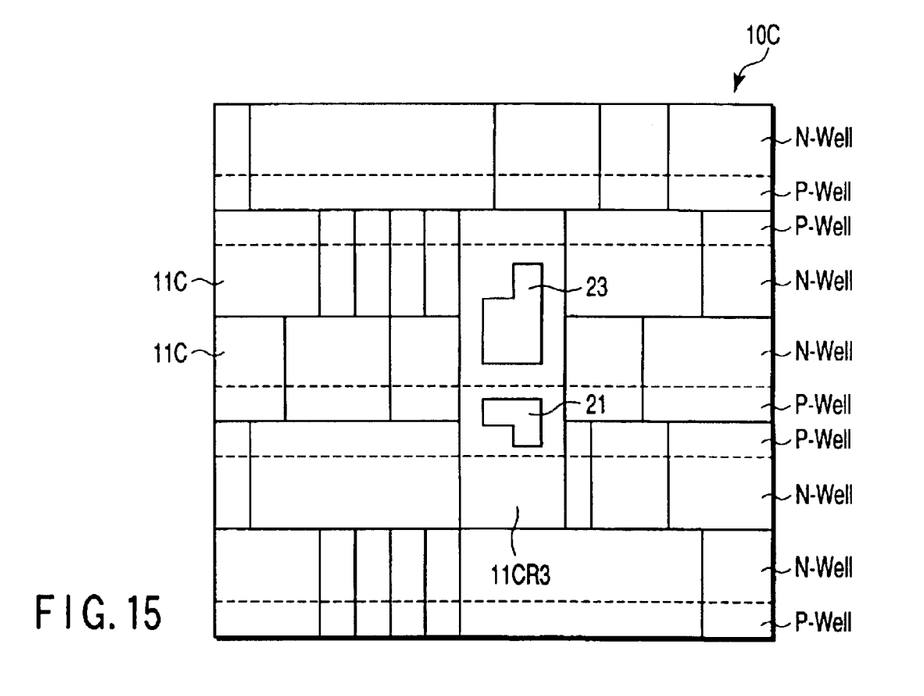
FIG. 15 is an enlarged plan view of part of FIG. 14.

FIG. 15 is an enlarged view of standard cell 11CR3 and its vicinity in the cell block 10C of FIG. 14. In a standard cell 11C with a normal cell height in the cell block 10C, an n-well region and a p-well region are provided so as to make a pair. Use of a standard cell 11CR3 with a triple cell height makes the boundary line between the p-well diffusion region and the n-well diffusion region continuous linearly between adjacent standard cells 11C with the normal cell height in the column direction, which makes it unnecessary to bend the boundary line.

In FIG. 15, too, the gate electrode of each of the NMOS transistor 21 and PMOS transistor 23 is not shown.

Fourth Embodiment

In a fourth embodiment of the present invention, the power supply voltage supplied to the cell block 10B is made different from that supplied to the cell block 10C as in the second embodiment in a semiconductor integrated circuit device where standard cells whose cell height is larger than that of the standard cell 11C are arranged in the cell block 10C as in the third embodiment.

In this case, in the cell block 10B of FIG. 7, the power supply line 31 for supplying power supply voltage VDD1 and the ground line 32 are provided along a column of standard cells 11B as shown in FIG. 11.

Figure 16:
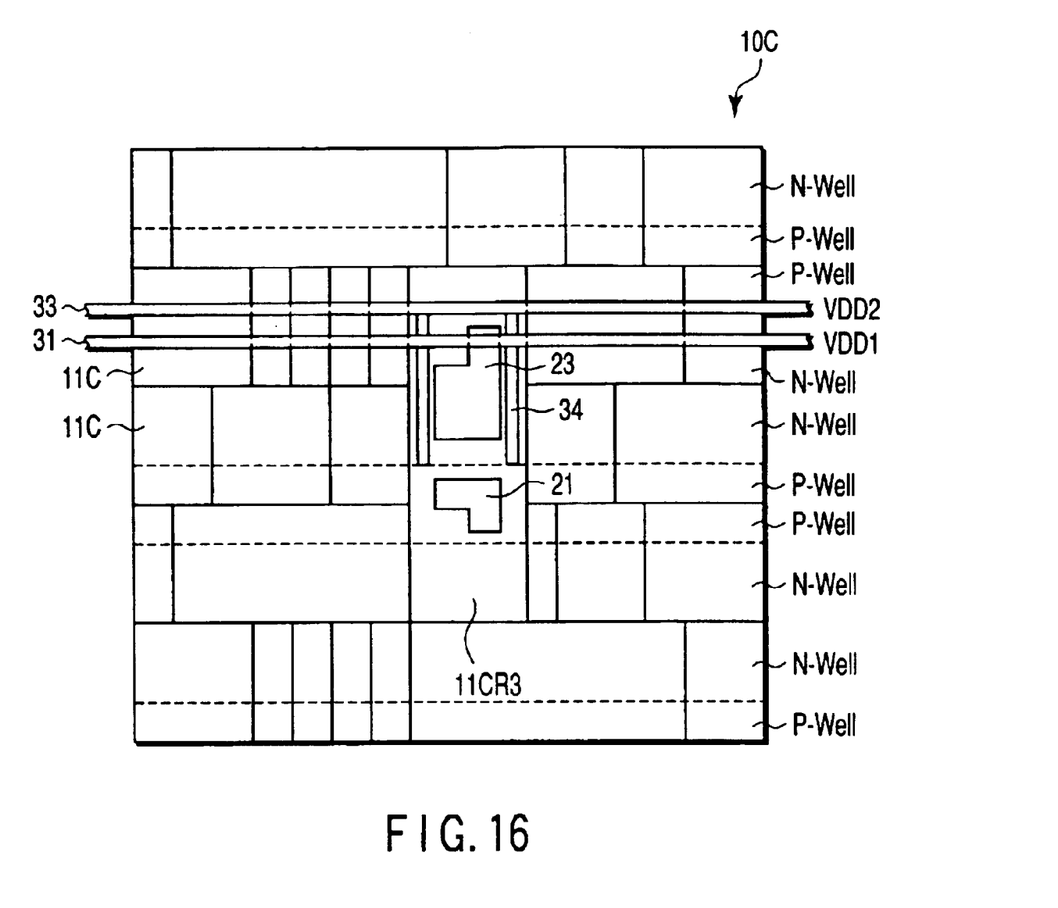
FIG. 16 is a plan view of a layout of a semiconductor integrated circuit device according to a fourth embodiment of the present invention.

In contrast, in the cell block 10C of FIG. 7, the power supply line 33 for supplying power supply voltage VDD2 and the ground line 33 are provided along a plurality of standard cells 11C and standard cell 11CR3 as shown in the plan view of FIG. 16.

In a column including the standard cell 11CR3 with a triple cell height used for constituting the repeater, the power supply line 31 for supplying power supply voltage VDD1 is also provided so as to run along the power supply line 33. The power supply line 31 is provided farther inside the cell than the power supply line 33. Power supply voltage VDD1 of the power supply line 31 is supplied to the standard cell 11CR3.

Around the PMOS transistor 23 provided in the n-well region of the standard cell 11CR3 to which power supply voltage VDD1 is supplied, an isolating region 34 as in FIG. 12 is provided to potentially separate the PMOS transistor 23 from another PMOS transistor formed in the same n-well region.

Although not shown in FIG. 16, a ground line is, of course, provided so as to run along the power supply lines 33, 31. Moreover, as in FIG. 15, the gate electrode of each of the NMOS transistor 21 and PMOS transistor 23 is not shown.

According to the fourth embodiment, even when the value of the power supply voltage supplied to the cell block 10B differs from that supplied to the cell block 10C, the same power supply voltage (VDD1) can be supplied to the standard cells 11BR, 11CR3 used for constructing the repeaters in the cell blocks 10B and 10C. As a result, even when a plurality of repeaters are composed of standard cells in the cell blocks 10B and 10C to which different power supply voltages are supplied, the characteristics of the plurality of repeaters can be equalized.

In the cell block 10C, a plurality of standard cells that operate on power supply voltage VDD2 differing from VDD1 can be arranged in each of the three columns including standard cells 11CR3 used for constructing repeaters. Consequently, the empty regions in the standard cells differing in power supply voltage can be reduced compared with the case where they are arranged in different columns, which helps increase the degree of integration.

While in each of the first to fourth embodiments, three or four cell bocks are provided in a semiconductor integrated circuit device, the present invention may be applied to a semiconductor integrated circuit device in which five or more cell blocks are provided.

While in each of the first to fourth embodiments, only CMOS transistors have been arranged in standard cells used for constructing repeaters, active elements, such as bipolar transistors or diodes, and passive elements, such as resistors or capacitors, may be provided together with CMOS transistors.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A standard-cell type semiconductor integrated circuit device comprising:

a first cell block in which a plurality of first standard cells are arranged, each cell having a first cell height and having first transistors provided therein; and a second cell block in which a plurality of second standard cells with a second cell height different from said first cell height and at least one third standard cell are arranged, the third standard cell having second transistors whose characteristics are the same as those of said first transistors provided therein and having a cell height N times (where N is a positive integer equal to or greater than 2) as great as said second cell height.

2. The device according to claim 1, wherein said first and second transistors have practically the same characteristics by making the gate widths, the areas of source and drain regions, and the shapes of the transistors practically the same.

3. The device according to claim 1, wherein the cell heights of said first and second cells are the outline dimension of a standard cell in the direction perpendicular to the direction in which the first or second standard cells are arranged.

4. The device according to claim 1, wherein each of said first and second transistors is composed of a CMOS transistor made up of an n-channel MOS transistor and a p-channel MOS transistor.

5. The device according to claim 4, wherein the p-channel MOS transistor of said second transistor composed of said CMOS transistor includes an isolating region provided around the MOS transistor.

6. The device according to claim 1, wherein the value of N is 3.

7. The device according to claim 1, wherein said second standard cell in which said second transistor is provided constitutes a repeater which buffer-amplifies a signal supplied to any one of said plurality of first standard cells.

* * * * *